(12) United States Patent
Garner et al.

(10) Patent No.: US 7,038,553 B2
(45) Date of Patent: May 2, 2006

(54) SCALABLE COMPUTER SYSTEM HAVING SURFACE-MOUNTED CAPACITIVE COUPLERS FOR INTERCOMMUNICATION

(75) Inventors: Robert Barton Garner, San Jose, CA (US); Winfried Wolfgang Wilcke, Los Altos Hills, CA (US); Barry Jay Rubin, Croton-On-Hudson, NY (US); Howard Kahn, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 10/264,893

(22) Filed: Oct. 3, 2002

(65) Prior Publication Data

US 2004/0066249 A1    Apr. 8, 2004

(51) Int. Cl.
*H01P 1/00* (2006.01)
(52) U.S. Cl. .................. 333/24 C; 333/260; 333/246
(58) Field of Classification Search .............. 333/24 C, 333/260, 246
See application file for complete search history.

(56) References Cited

U.S. PATENT DOCUMENTS

| | | | |
|---|---|---|---|
| 4,486,739 A | 12/1984 | Franaszek et al. | |
| 4,674,010 A | 6/1987 | Van Den Steen | |
| 4,884,982 A | 12/1989 | Fleming et al. | |
| 5,065,277 A | 11/1991 | Davidson | |
| 5,274,336 A | 12/1993 | Crook et al. | |
| 5,629,838 A | 5/1997 | Knight et al. | |
| 5,714,864 A | 2/1998 | Rose et al. | |
| 5,870,067 A | 2/1999 | Smith | |
| 5,936,841 A | 8/1999 | Kantner et al. | |
| 5,977,841 A | 11/1999 | Lee et al. | |
| 6,033,263 A | 3/2000 | Weidler et al. | |
| 6,205,138 B1 | 3/2001 | Nihal et al. | |
| 6,299,280 B1 | 10/2001 | Coudray et al. | |
| 6,362,972 B1 | 3/2002 | Panella | |
| 6,525,620 B1* | 2/2003 | Barabash | 333/24 C |
| 6,554,492 B1* | 4/2003 | Gilliland et al. | 385/88 |
| 6,563,042 B1* | 5/2003 | Barabash | 174/35 R |
| 2002/0044426 A1 | 4/2002 | Tokuhara | |

\* cited by examiner

*Primary Examiner*—Robert Pascal
*Assistant Examiner*—Kimberly Glenn
(74) *Attorney, Agent, or Firm*—Khanh Q. Tran; Mark C. McCabe (57) ABSTRACT

A scalable and compact computer system of three-dimensional subsystems each having capacitive couplers on its external surfaces for transmitting and receiving electrical signals to and from adjacent subsystems. Each surface having an electrically non-conducting substrate, one or more electrically conducting pads on the substrate, and electrical leads for coupling the pads to the subsystem's circuits. Two adjacent pads, each from a different subsystem, form a capacitive coupler to carry the signals between the subsystems. The pads are covered by a low-loss dielectric material having a large dielectric constant for improved signal transmission. A differential signal may be supported using two capacitive couplers to respectively carry the positive and negative signals of the differential signal. The subsystems might be replaced or left in place when they failed. Additional subsystems might be added to the system to expand its capacity.

18 Claims, 8 Drawing Sheets

SCALABLE COMPUTER SYSTEM HAVING SURFACE-MOUNTED CAPACITIVE COUPLERS FOR INTERCOMMUNICATION

TECHNICAL FIELD

The present invention relates to computer systems, and more particularly, to a scalable computer made of subsystems each having capacitive couplers mounted on subsystem surfaces for communication with the adjacent subsystems.

BACKGROUND OF THE INVENTION

Contemporary computer and communications systems commonly comprise several subsystems, each implementing one or more computation or communication functions. Examples include compute servers, Internet web servers, storage servers, and packet-based communications switches. Each subsystem includes its unique electrical and mechanical elements, including printed-circuit wiring board assemblies, internal wiring and connectors, etc. Each subsystem is outfitted with external connector sockets for communicating with other subsystems and for drawing power. The subsystems are mounted in proximity to each other in mechanical structures in the form of industry standard sized racks or custom-sized chassis.

Figure 1:
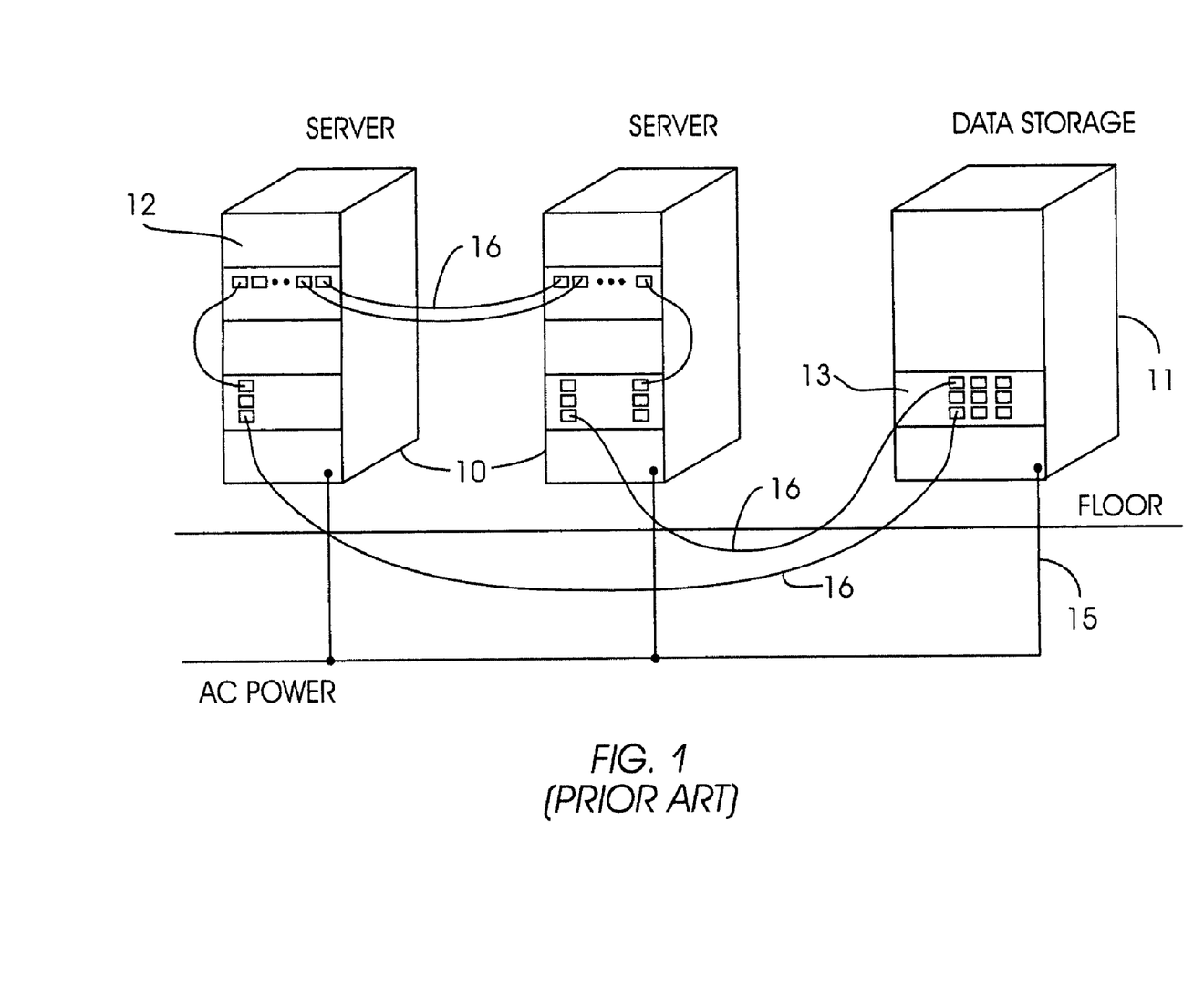
FIG. 1 illustrates a typical configuration of prior art computer and communications systems.

FIG. 1 illustrates a representative contemporary computing center having two servers 10 and a data storage 11. The servers 10 include subsystems 12 that are housed in industry-standard 19-inch racks. The subsystems 13 of the storage 11 are housed in a custom-size chassis. The servers 10 and storage 11 are typically in an environmentally controlled data center or server room. The subsystems 12–13 are interconnected with each other and to outside communication links through electronic or optical cables 16. AC or DC electrical power must also be supplied to the subsystems 12–13 and is typically distributed via under floor cabling 15 from a power source.

The rack/chassis-based architecture of FIG. 1 has several advantages: (1) the subsystems may be arbitrarily arranged in the room, subject to cooling and cabling distance constraints, and (2) the subsystems may have different form factors. However, this type of packaging suffers from several operational disadvantages: (1) scaling difficulty; (2) cable management; (3) connector unreliability; and (4) unreliability of wire and cable assemblies. These problems contribute to the overall unreliability of today's high-performance computer and communications systems and lead to increased costs of ownership, maintenance, and upgrade of the systems.

The first disadvantage of current computer and communications systems is the difficulty one would encounter when the system's capacity or functions need to be expanded. This can occur even if a system was designed to accommodate a certain degree of growth. For example, to connect a new server into a network, additional communication cables need to be connected to a network switch. However, if the switch is fully allocated at capacity with insufficient free network ports, the upgrade becomes difficult and costly, particularly if the system must remain operational while the expansion is performed.

The second disadvantage of current computer and communications systems is the management of interconnect cabling and wiring. Given the large number of wires and cables in a computer facility, it is not uncommon that service and support personnel may incorrectly connect or disconnect a cable. The potential for other errors, such as plugging a cable into a wrong subsystem and leaving a cable unconnected, can also occur, particularly when system operation must be restored quickly. For optical cables, one must select the proper speed, wavelength, and distance parameters.

The third disadvantage of current computer and communications systems is the unreliability of connectors. Electrical connectors can degrade over time due to micro-fretting wear, which can lead to corrosion. As a metal connector corrodes, its electrical resistance increases, causing intermittent or hard failures in the system. Optical connectors may be mishandled, jarred, or contaminated by finger oil or dust, causing an intermittent open circuit in the system. In addition, optical-to-electrical transceivers can fail. These hazards and failures result in an increased cost of maintenance for the system.

The fourth disadvantage of current computer systems is the unreliability and cost of cables. Both electrical and optical cables can be broken, cracked, bent, compressed, or otherwise mishandled. Glass-based optical cables can also be damaged if stepped on or if the maximum bending radius is exceeded. Although cables are typically designed to meet certain system parameters, they are not always manufactured to such tolerances.

Electrical cables may also carry undesirable shield or ground currents between subsystems with chassis grounds or signal grounds at different electrical potentials, particularly when the subsystems are powered from different AC branch circuits. Cables can also undesirably pick up external electromagnetic interference or electrostatic discharges. These unwanted shield, ground, or signal currents can cause intermittent or hard errors in the communication between the subsystems, resulting in transient or hard failures in the whole systems.

The above disadvantages contribute to the unreliability, inflexibility, and high cost of ownership of existing computer and communications systems. Therefore, there remains a need for a modular computer system that has reliable and simple interconnection, and is easy to expand and service.

SUMMARY OF THE INVENTION

An object of the invention is a reliable design for computer systems that eliminates conventional connectors and cables for subsystem communications. Another object of the invention is a computer system that can be easily expanded in terms of functions and capacity with minimum disruption to its operation.

A further object of the invention is a highly compact design for computer systems to reduce ongoing support, maintenance, space and ownership costs.

A yet another object of the invention is the ability to physically insert and remove subsystems into and from the computer systems with only a straight sliding motion.

To achieve these and other objects, the present invention provides a computer system made up of subsystems, or "bricks", arranged together such that adjacent subsystems communicate with each other via surface-mounted capacitive couplers located on the subsystem surfaces. The subsystems may be arranged into a two-dimensional or three-dimensional structure to perform general-purpose computing, data storage, and network communications, or a combination of such functions. In a preferred embodiment of the invention, cubical subsystems are used to implement the computer system.

Each capacitive coupler includes two half-couplers where each half-coupler is located on an external surface of a subsystem. Each half-coupler includes an electrically non-conducting substrate, one or more electrically conducting pads on the substrate where the pads are coupled to the carrying subsystem's electrical circuits through electrically conducting leads. To improve the transmission of electrical signals and provide DC-isolation between the subsystems, the pads are covered with a low-loss dielectric material that has a high dielectric constant. In addition, the signal is preferably a differential signal that includes a positive signal and a negative (complemented) signal. Two pads (on a half-coupler) from each subsystem are used to carry the positive and negative signals. These two pads are referred to as a differential pad pair.

Differential transmitting and receiving circuits are typically coupled to the transmitting and receiving half-couplers on each subsystem to support the differential signals transmitted and received by the subsystem, respectively. The transmitting and receiving circuits are in turn coupled to the rest of the electronics in the subsystem. The signal might be a bi-directional signal.

In a preferred embodiment of the invention, the system is a three-dimensional computer system made up of cubical subsystems. Each subsystem includes an 8-port, packet-based switch chip that is bi-directionally connected to six half-couplers and an internal processor through a Network Interface chip. In addition, the switch is connected to an external network through a Media Access Controller (MAC) and an Encoder/Decoder (ENDEC) and Serializer/Deserializer (SERDES) chip. The subsystem provides a total bandwidth of 20 Gigabytes per second in and out of the subsystem.

In order to have an effective capacitive coupling between two adjacent subsystems, a light pressure is preferably provided to hold the opposing half-couplers together, using a spring mechanism. In addition, the half-couplers are typically mounted on non-conducting carriers that have bumps and depressions so that the conducting pads are properly aligned across the opposing half-couplers effectively.

Additional objects and advantages of the present invention will be set forth in the description which follows, and in part will be obvious from the description and the accompanying drawing, or may be learned from the practice of this invention.

DESCRIPTION OF THE PREFERRED EMBODIMENTS

Figure 2:
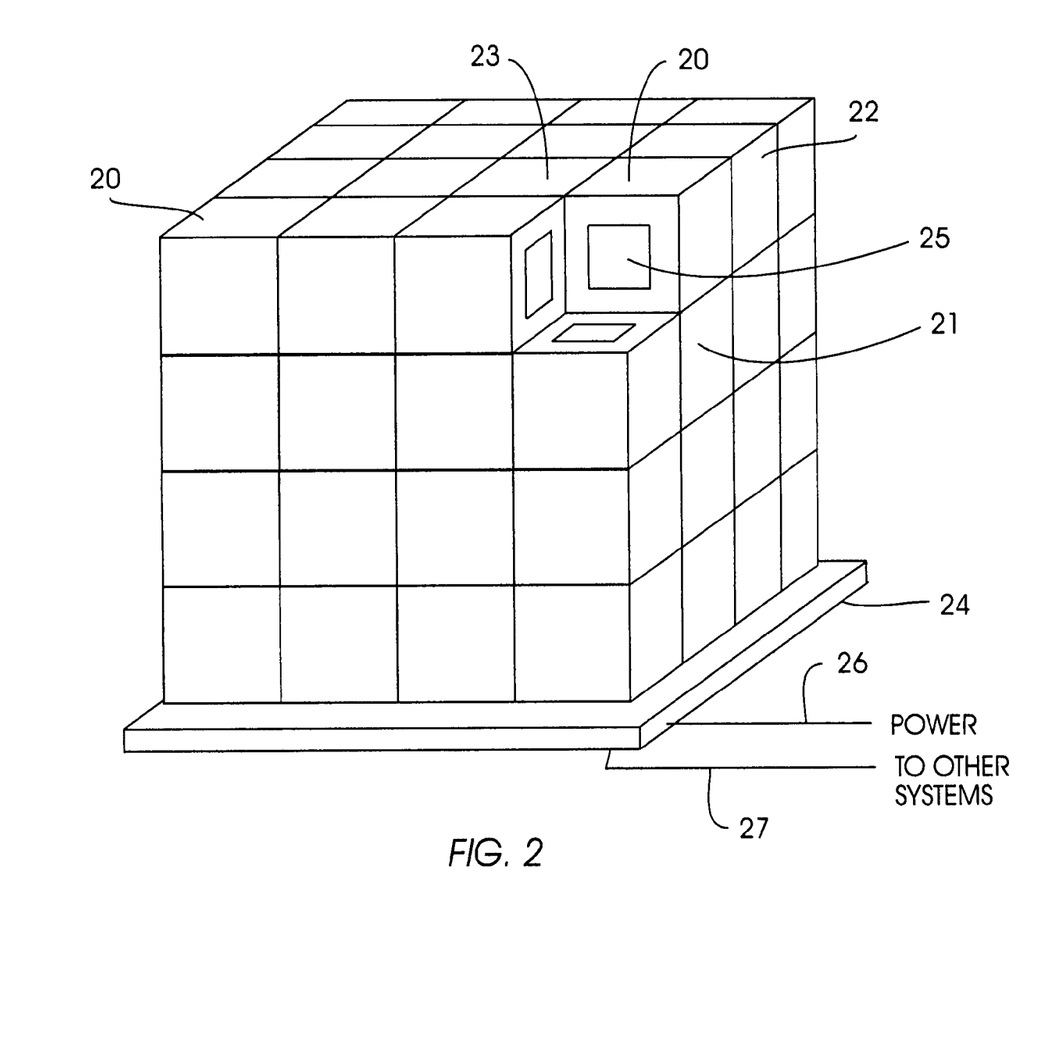
FIG. 2 shows a scalable three-dimensional computer system in accordance with the invention.

The invention is a highly scalable and dense architecture for computer or communications systems. The systems are made up of externally identical subsystems, also referred to as "bricks", each having capacitive half-couplers on its external surfaces for communicating with the surrounding subsystems. Although capacitive couplers are used to describe the invention, other types of couplers might be adapted for the systems of the invention, such as optical couplers. FIG. 2 shows a preferred embodiment of a scalable three-dimensional computer system of the invention. The system includes multiple subsystems 20 stacked together so that each subsystem has at least one surface that is in close proximity or in contact with at least one surface of another subsystem. For example, in FIG. 2, the subsystem 20 is in contact with the subsystems 21 through 23. Each subsystem surface includes one or more capacitive half-couplers 25 which will be described in detail below. Each subsystem 20 might be a data processing unit (server), a data storage unit, a networking unit, or some other computer-related functions. Through the alignment of the capacitive half-couplers 25, the subsystems 20 together perform the computation or communication functions of the whole system without conventional cables and connectors between them.

In a preferred embodiment of the invention, the subsystems 20 reside on a support base 24 to provide mechanical structural support for the subsystems and through which power is delivered to the subsystems with power connection 26. The base 24 may also accommodate connection 27 to other systems or an external communications network. Typically, there is also some mechanism for removing heat generated by the subsystems (not shown).

Figure 3:
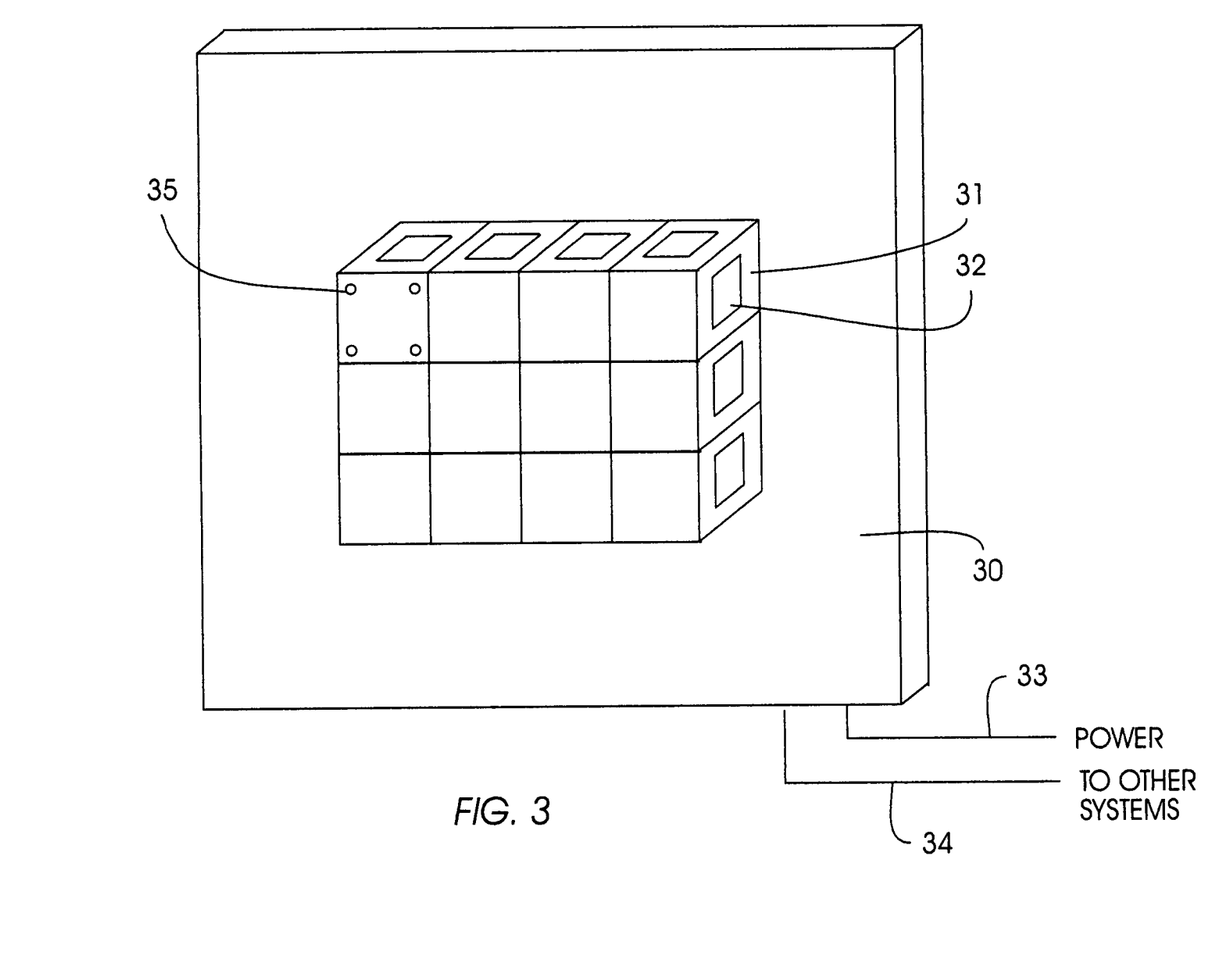
FIG. 3 depicts a preferred embodiment of a wall-mounted scalable two-dimensional computer or communications system of the invention.

The subsystems of the invention are arranged in a structure such that they are physically very close to each other to form operable capacitive couplers between them. In addition, to form a useful computer or communications system, the subsystem bricks are arranged in a two-dimensional or three-dimensional structure so as to maximize the number of subsystem surfaces in contact with other subsystem surfaces. Although the preferred embodiment of the invention in FIG. 2 is made up of cubical subsystems 20 with six surfaces each, other brick shapes are also possible. For example, the shape of a subsystem may be a triangular prism (five surfaces), a hexagonal prism (eight surfaces), or a dodecahedron (twelve surfaces). FIG. 3 illustrates an example of a two-dimensional structure of cubical subsystems in which the subsystems 31 are attached to a support wall 30. The support wall 30 has power connection 33 through which power is delivered to the subsystems. Each subsystems 31 communicates with its adjacent subsystems through couplers 32. To provide sufficient alignment between opposing half-couplers, mechanical means such as screws 35 may be used to hold the subsystems 31 to the support wall 30 and to hold the subsystems 31 together. In addition, interlocking or alignment means such as surface bumps and depressions may be used to assure that opposing half-couplers are properly positioned, aligned, and touching each other.

Figure 4:
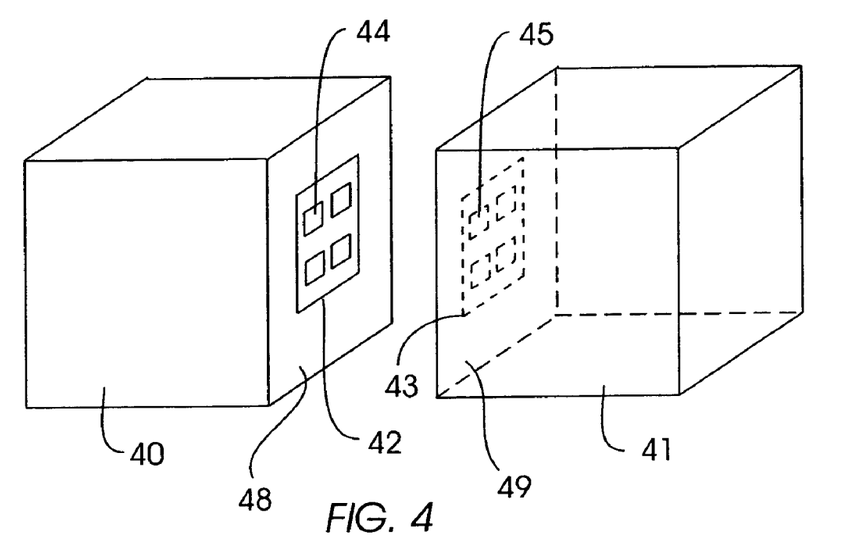
FIG. 4 shows an example of two adjacent subsystem bricks with their aligned, opposing capacitive half-couplers according to the invention.

FIG. 4 shows two adjacent subsystems 40 and 41 (separated for clarity) with their half-couplers 42 and 43, respectively. The half-couplers 42 and 43 are located on the subsystem surfaces 48 and 49, and are electrically connected to the subsystem circuits, respectively. The subsystem circuits are omitted from this figure for clarity. As the subsystems 48–49 are brought together and properly aligned, the half-couplers 42–43 form a capacitive coupler to support communications between the subsystems.

A capacitive coupler comprises two parts: a half-coupler 42 and a half-coupler 43. Although each half-coupler might include both transmitters and receivers, FIG. 4 shows only a transmitter pad 44 on the half-coupler 42 and a receiver pad 45 on the half-coupler 43 for clarity. The transmitting half-coupler 42 is located on the surface 48 of subsystem 40. The receiving half-coupler 43 is located on the surface 49 of subsystem 41. The half-coupler 42 conveys electrical signals to the half-coupler 43. These signals are time-varying for encoding the information being communicated between the subsystems 40 and 41.

Figure 5:
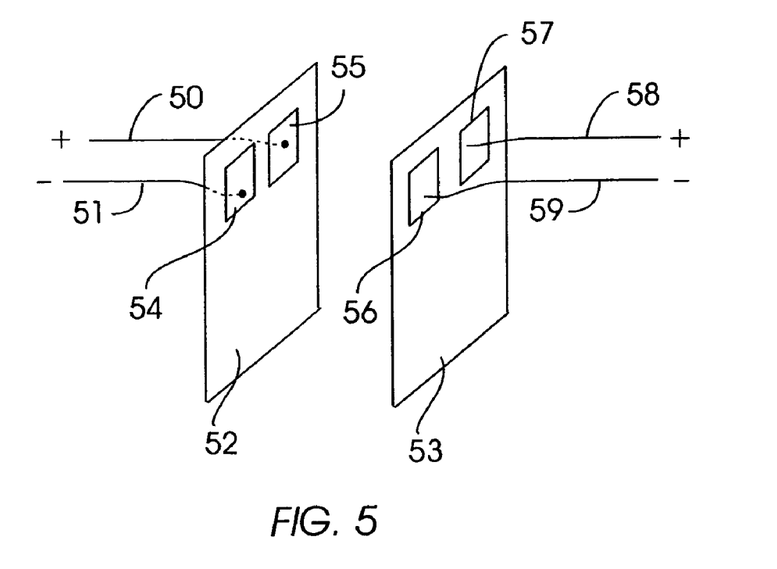
FIG. 5 illustrates an example of the electrically conducting pads for the capacitive couplers of the invention.

For improved performance, the subsystems typically transmit and receive electrical signals in differential form, i.e., a complementary pair of positive signal and negative signal. Thus, two pairs of pads are needed to convey a differential signal between the opposing half-couplers on two subsystems. FIG. 5 illustrates a differential capacitive coupler to support differential signaling. The differential capacitive coupler comprises half-couplers 52 and 53. The half-coupler 52 includes differential pad pair 54 and 55, which are connected to subsystem leads 50 and 51, respectively. The half-coupler 53 includes opposing differential pad pair 56 and 57, which are connected to subsystem leads 58 and 59, respectively. The pads 55 and 57 convey the positive signal of the differential signal. The pads 54–56 convey the negative signal of the differential signal.

Figure 6:
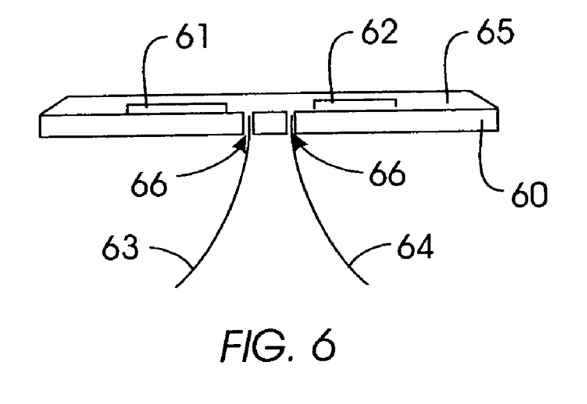
FIG. 6 depicts a side view of a differential capacitive half-coupler in accordance with the invention.

FIG. 6 shows a side view of a differential pad pair for supporting a differential signal, such as the differential pad pair 54–55 in FIG. 5. It includes an electrically nonconducting substrate 60 with metallic pads 61 and 62 deposited or affixed to the substrate 60. The metallic pads 61 and 62 are covered by a very thin layer of insulating dielectric material 65, and are connected to the subsystem circuits (not shown) through electrically conducting leads 63 and 64, respectively. Preferably, the leads 63–64 are connected to the metallic pads 61–62 through small vias 66 in the substrate.

In a preferred embodiment of the invention, a half-coupler is designed and manufactured using a standard, multi-layer, thick-film, screen-print-process ceramic module technology. The substrate 60 in FIG. 6 is made of Alumina and is 1 mm thick. The metallic pads 61–62 are preferably made of silver palladium with a 7-micron thickness. The dielectric coating 65 is preferably a standard crystalizable, screen-printed, thick-film dielectric material with a relative permittivity or dielectric constant of 8 to 10, and a thickness of 7 microns. A preferred dielectric material is DuPont Electronics QM44. The dielectric coating over the pads can provide about 500 V of electrostatic discharge (ESD) isolation per pad (or 1000 V between differential pair pads), and 1 Megaohm of resistance. It is assumed that the subsystem electronics provides additional ESD input series protection.

When two capacitive half-couplers are properly aligned to form a capacitive coupler, the dielectric coating 65 is preferably in light physical contact with the dielectric coating of the opposing half coupler. The close proximity of the differential metallic pads and the dielectric coatings, and any undesirable intervening air gap, forms a parallel-plate capacitor. Due to the capacitor's displacement current, a time-varying signal is electromagnetically conveyed between the two opposing half-couplers.

Figure 7:
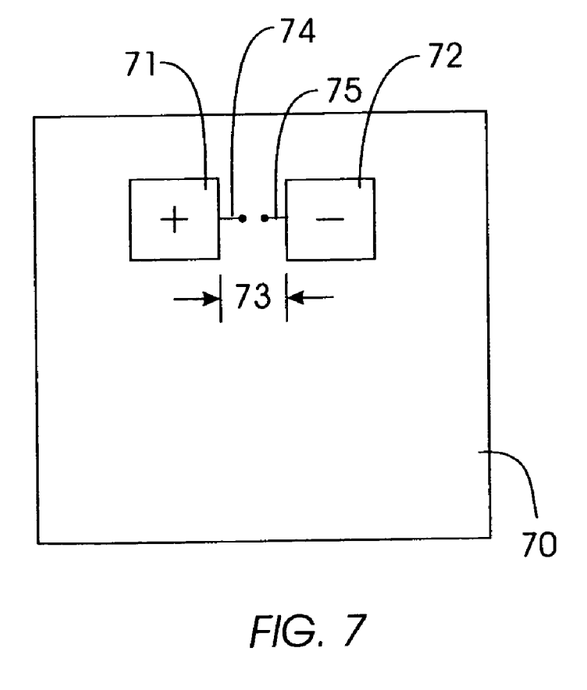
FIG. 7 shows a top view of a differential capacitive half-coupler in accordance with the invention.

FIG. 7 depicts a top view of the differential capacitive half-coupler of FIG. 6. The metallic pads 71 and 72 are disposed on a substrate 70 and covered by a dielectric material (not shown). Electrical leads 74 and 75 respectively connect the pads 71 and 72 to a subsystem electronics. The outer dimensions of the pads 71–72 are typically 5 to 9 mm on each side. The separation 73 between the positive pad 71 and negative pad 72 is typically in the range of 2 to 6 mm.

Figure 8:
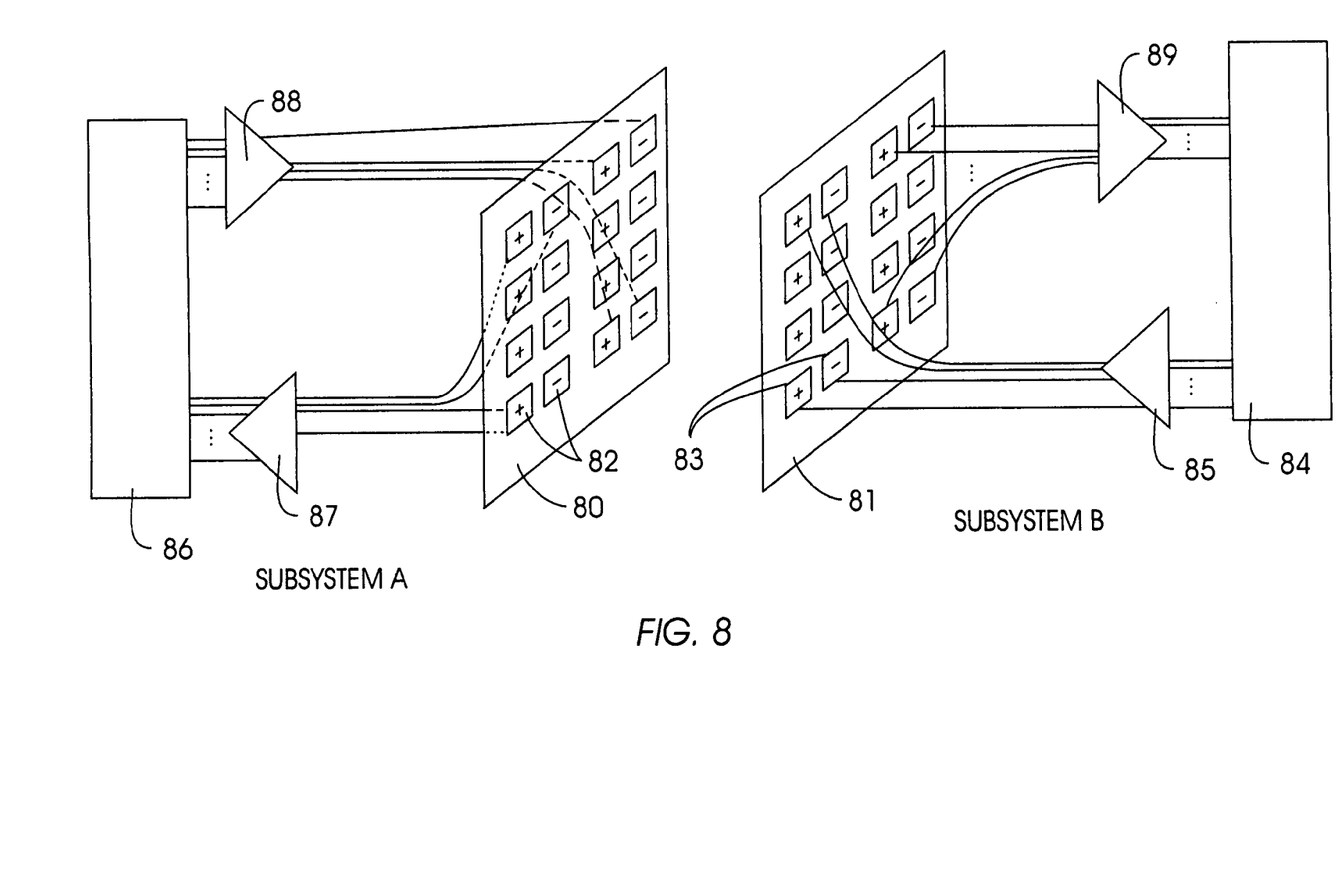
FIG. 8 illustrates a representative wiring between the electrically conducting differential pads and the subsystem electronics in accordance with the invention.

FIG. 8 illustrates a preferred embodiment of multiple differential capacitive couplers between two subsystems A and B, shown side-by-side. The subsystems A and B typically include internal electronics circuits 86 and 84, respectively, for providing computing and communication functions as discussed earlier. The differential pad pairs 82 of the subsystem A are located on the half-coupler 80. The differential pad pairs 83 of the subsystem B are located on the half-coupler 81. The transmitting half-couplers of the subsystem A are coupled to the subsystem electronics 86 through a transmitter circuit 88. The receiving differential pad pairs of the subsystem A are coupled to the subsystem electronics 86 through a receiver circuit 87. Similarly, the transmitting and receiving differential pad pairs of the subsystem B are coupled to its electronics 84 through a transmitter circuit 85 and receiver circuit 89, respectively. Note that the receiving pad pairs 82 of the subsystem A are opposite the transmitting pad pairs 83 of the subsystem B.

Since there are four differential pad pairs connected to the transmitter 88 of the subsystem A and four differential pad pairs connected to the receiver 89 of the subsystem B, four signal channels are available to convey data from subsystem A to subsystem B simultaneously. In the opposite direction, four channels are available to receive data from subsystem B to subsystem A using the remaining differential pad pairs.

The number of transmitting and receiving couplers in each subsystem depends on the required subsystem interconnect communications bandwidth needed by the subsystem electronics. For example, if each pad or wire pair is capable of 3.125 Gigabits/second, then the aggregate bandwidth per a coupler's four unidirectional differential lines is 12.5 Gbits/second. Bidirectionally, that is 12.5 Gigabits/second into the subsystem and 12.5 Gbits/second out of the subsystem. If each differential line is 8B/10B encoded, the aggregate usable bandwidth between a pair of subsystems with these four bidirectional channels is 20 Gigabits/second, or 2.5 Gigabytes/second.

The half-coupler 80 can convey to the half-coupler 81 of FIG. 8 one or more separate, bit-serial data channels according to a packet-based communications data link physical layer standard, such as Ethernet, Fibre Channel, or Infini-Band.

In the preferred embodiments of the invention, it is assumed that the physical layer is based on bit-serial, 8B/10B data encoding, non-return-to-zero, and differential voltage levels. For a description of an 8B/10B encoding, see, for example, "Byte-Oriented DC-balanced (0,4) 8B/10B Partitioned Block Transmission Code," U.S. Pat. No. 4,486,739. A receive clock may be derived from the received serial data stream by the subsystem electronics. Other data link and physical layer protocols might be used, although in general the capacitive coupler requires a sufficient frequency bandwidth to convey the data link code's lowest-frequency components.

Figure 9:
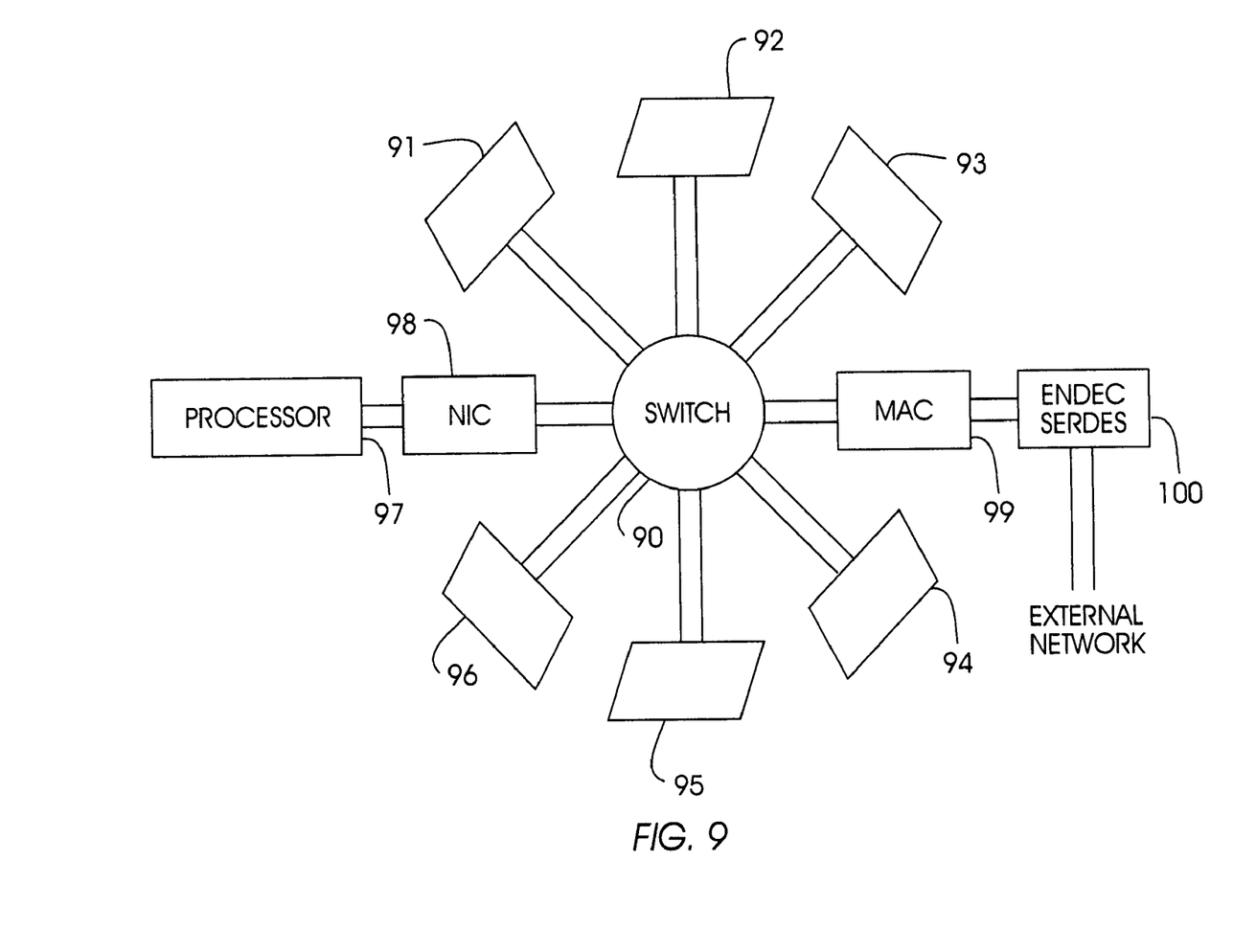
FIG. 9 is a block diagram showing the subsystem circuit functions of a preferred embodiment for a cubical subsystem accordance to the invention.

FIG. 9 illustrates a block diagram showing the main functions of a preferred embodiment of a typical cubical subsystem brick. The subsystem includes an 8-port, low-latency packet-based switch chip 90 that is bi-directionally connected to six half-couplers 91–96 and an internal processor 97 through a Network Interface Chip (NIC) 98. In addition, the switch 90 is connected to an external network through a Media Access Controller (MAC) 91 and an Encoder/Decoder (ENDEC) and Serializer/Deserializer (SERDES) chip 92. This connection is typically located on the external surface of an outside subsystem in a system for easy access. Using the same example parameters from above for the couplers, this cubical subsystem would offer 20 Gigabytes/second (8×2.5) of total bandwidth in and out of the subsystem.

In the preferred embodiments of the invention, the characteristic impedance of a low-loss differential coupler should be close to some fixed value, such as 100 ohms, from the subsystem electronics, through the wire-pair transmission line, and up to the differential half-couplers. The transmission line can be two separate, 50-ohm coaxial cables; 100-ohm differential-pair coaxial cable; 100-ohm twisted pair of wires; or a twin-ax coaxial cable. A differential signaling pair of wires is preferred because it conveys electromagnetic signals over the two wires and through the coupler via a propagating electromagnetic wave without conveying any significant ground return current or other common-mode currents which could possibly cause unwanted noise interference. The differential signal voltage levels preferred are typically under 1 V peak-to-peak.

Furthermore, a capacitive coupler is designed such that its frequency response is as non-attenuating as reasonably achievable over the expected operating regime, typically for a frequency pass band from 100 MHZ to 7 GHz. The high-frequency roll off requirement is determined by the ability of the receive electronics and to recover the encoded data from the signal, given the receive "eye pattern" at the receive electronics. These signal processing circuits may include the ability to perform inverse transformation on the encoded signals, either before transmission or after reception, in order to remove the frequency-dependent, intersymbol interference. The low-frequency roll off requirement is given by the lowest frequency that needs to be transmitted through the coupler as dictated by the physical layer code and the channel bit-error reliability. As the conveyed data speed and frequency content increases, the requirements for the minimum capacitance decreases. For example, the 8B/10B code defines a code such that there are never more than five consecutive bits of the same polarity on the link. For example, a 3.125 gigabit/second signal (with 320-ps bit-cell widths) does not have significant low-frequency content below $1/((5+5) \times 0.32 \text{ nS}) = 312$ MHZ.

In the preferred embodiments of the invention, during construction and before pad deposition, the half-coupler Alumina substrate is milled using standard silicon wafer grinding machinery to a flatness tolerance of plus or minus 3 microns or better over the necessary pad area. This is done to minimize the size of the unwanted resulting air gap between opposing capacitive half couplers. Because the coupler can be modeled as two capacitors in series—the first, $C_{air}$, due to the dielectric of any air and the second, $C_{coating}$, due to the dielectric coating over the pads—the overall approximate capacitance of a capacitive coupler, calculable by $1/(1/C_{air}+2/C_{coating})$, approaches the value of $C_{air}$ and can not exceed $C_{air}$, even as $C_{coating}$ increases without limit. However, higher dielectric film permittivities, and thus higher $C_{coating}$, are preferred as they result in a total capacitance that more closely approaches the capacitance determined by the air gap, $C_{air}$. The typical capacitance developed between contacting half-couplers, depending on their size and the flatness of the ceramic substrates, ranges to between 20 to 100 picoFarads.

In addition to Alumina, another preferred material for the coupler substrate is a flexible kapton film, in place of the rigid ceramic plate. An advantage of a kapton film substrate is that it need not be precisely planar but only needs to conform with its opposing, flexible kapton half coupler.

As for the dielectric coating over the metallic pads, in addition to Dupont QM44, other high-dielectric materials may be used such as barium titanate which is titanium-oxide based and has a dielectric constant ranging from 30 to 60.

Figure 10:
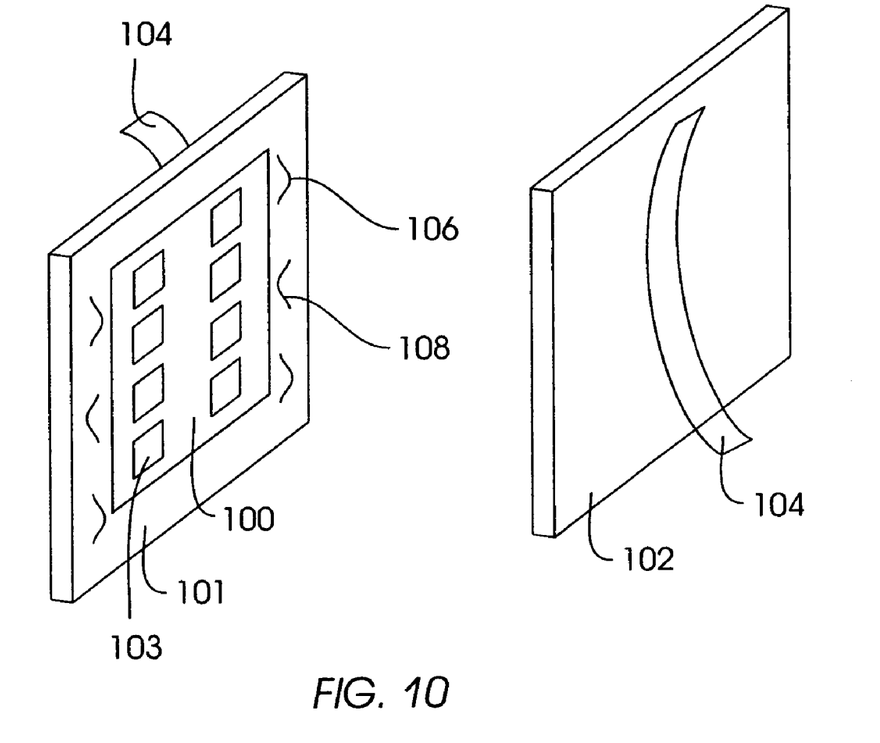
FIG. 10 illustrates an example of the alignment and clamping means for a half-coupler of the invention.

In general, the capacitive half couplers are mounted on a subsystem's external surfaces so that they just touch opposing half-couplers with a light pressure to minimize any intervening air. Alignment bumps and depressions might be provided on the surface of a coupler's carrier so that the transmitting pads are aligned directly opposite the receiving pads. FIG. 10 shows a preferred embodiment of the capacitive couplers with an alignment mechanism and carriers for supplying a light pressure between the half-couplers. The pads 103 are mounted on an Alumina substrate 100, which is mounted in a plastic carrier 101. The plastic carrier 101 is in turn mounted in an opening in the surface of the subsystem (not shown). There is a spring mechanism 104 that gently pushes the carrier 101 attached to the substrate 100 in an outward direction from the center of the subsystem. When two subsystems slide past one another, the plastic carrier 101 is used to separate the substrates of the two half-couplers from each other while traveling past each other. The plastic carrier 101 has bumps 106 that push the opposite plastic carrier 102 away from it while moving, and then, when in position, fit into depressions (similar to depressions 108 shown on carrier 101) in the opposing carrier 102. Depressions 108 in the half-coupler carriers might have a conical shape to guide their opposing bumps into position more accurately. The plastic carriers 101–102 need some freedom of lateral movement to accommodate to subsystem misalignment.

It is important to align the opposing pads of a coupler because any misalignment will decrease the effective capacitance of the coupler and reduce its performance. A misalignment of the pads for a differential coupler in the direction of the positive and negative pads of a differential half-coupler should not be more than some fraction of the separation between the positive and negative pads, or else there will be unwanted positive to negative pad coupling. A misalignment in the direction perpendicular to the two pads of a differential half-coupler should not be more than some fraction of the distance to any surrounding pads or the edge of the substrate, or so much that the capacitance of the coupler is reduced and the signal quality compromised.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A computer system comprising:
   a plurality of three-dimensional subsystems each having one or more external surfaces, at least a first surface of each subsystem being adjacent and conforming to a second surface of another subsystem, each surface including:

an electrically non-conducting substrate;

a plurality of electrically conducting pads disposed on said substrate, wherein the pads are covered by a dielectric material; and an electrical lead attached to each pad;

wherein two of said pads, respectively disposed on the first and second surfaces, form a capacitive coupler to allow a time-varying electrical signal to be conveyed between the respective subsystems, and the dielectric material has low-loss characteristics and a large dielectric constant for improved signal conveyance.

2. The system as in claim 1 wherein:

the signal is a differential one having a positive signal and a complementary negative signal; and the capacitive coupler between two subsystems carries the positive signal and the negative signal.

3. The system as in claim 1, wherein the surfaces are generally flat.

4. The system as in claim 1, wherein:

each subsystem includes electrical circuits; and the electrical leads of the capacitive coupler on the subsystem are coupled to the electrical circuits.

5. The system as in claim 1, wherein:

each pad includes a plurality of vias; and the electrical leads are attached to the pads through said vias.

6. The system as in claim 1, wherein the first and second surfaces are in contact.

7. The system as in claim 1, wherein the first and second surfaces are slidable past each other.

8. The system as in claim 7, wherein the first and second surfaces includes means for aligning the two of said pads.

9. The system as in claim 7, wherein the first and second surfaces are held together by a mechanical means.

10. The system as in claim 1, wherein each subsystem is a storage device capable of storing, receiving and sending data.

11. The system as in claim 10, wherein each subsystem includes a plurality of data-storage disks and supporting electrical circuits.

12. The system as in claim 1, wherein each subsystem is a data processing subsystem.

13. The system as in claim 1, wherein each subsystem is a data communications subsystem.

14. The system as in claim 1, wherein each subsystem is a cube having six external surfaces.

15. A data storage system comprising:

a plurality of data storage subsystems each having one or more external surfaces, at least a first surface of each subsystem being adjacent and conforming to a second surface of another subsystem, each surface including:

an electrically non-conducting substrate;

a plurality of electrically conducting pads disposed on said substrate; and an electrical lead attached to each pad;

wherein two of said pads, respectively disposed on the first and second surfaces, form a capacitive coupler to allow an electrical signal to be conveyed between the respective subsystems.

16. A computer system comprising:

a plurality of three-dimensional subsystems each having one or more external surfaces, at least a first surface of each subsystem being adjacent and conforming to a second surface of another subsystem, wherein the first and second surfaces are slidable past each other, each surface including:

an electrically non-conducting substrate;

a plurality of electrically conducting pads disposed on said substrate; and an electrical lead attached to each pad;

wherein two of said pads, respectively disposed on the first and second surfaces, form a capacitive coupler to allow an electrical signal to be conveyed between the respective subsystems.

17. A computer system comprising:

a plurality of three-dimensional subsystems, wherein each subsystem is a storage device capable of storing, receiving and sending data, and each subsystem having one or more external surfaces, at least a first surface of each subsystem being adjacent and conforming to a second surface of another subsystem, each surface including:

an electrically non-conducting substrate;

a plurality of electrically conducting pads disposed on said substrate; and an electrical lead attached to each pad;

wherein two of said pads, respectively disposed on the first and second surfaces, form a capacitive coupler to allow a time-varying electrical signal to be conveyed between the respective subsystems.

18. A computer system comprising:

a plurality of three-dimensional subsystems, wherein each subsystem is a cube having six external surfaces, and each subsystem having one or more external surfaces, at least a first surface of each subsystem being adjacent and conforming to a second surface of another subsystem, each surface including:

an electrically non-conducting substrate;

a plurality of electrically conducting pads disposed on said substrate; and an electrical lead attached to each pad;

wherein two of said pads, respectively disposed on the first and second surfaces, form a capacitive coupler to allow a time-varying electrical signal to be conveyed between the respective subsystems.

* * * * *